(12) United States Patent
Nakashiba et al.

(10) Patent No.: US 7,989,148 B2
(45) Date of Patent: Aug. 2, 2011

(54) METHOD FOR FORMING PHOTOELECTRIC COMPOSITE BOARD

(75) Inventors: Tooru Nakashiba, Osaka (JP); Hiroyuki Yagyu, Hirakata (JP); Shinji Hashimoto, Kadoma (JP); Yuuki Kasai, Hirakata (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 956 days.

(21) Appl. No.: 11/875,112

(22) Filed: Oct. 19, 2007

(65) Prior Publication Data

US 2009/0104565 A1    Apr. 23, 2009

(51) Int. Cl.
*G03F 7/20* (2006.01)
*G02B 6/13* (2006.01)

(52) U.S. Cl. .................. 430/318; 430/319; 430/321
(58) Field of Classification Search .................. None
See application file for complete search history.

(56) References Cited

U.S. PATENT DOCUMENTS

| | | | |
|---|---|---|---|
| 6,438,281 B1* | 8/2002 | Tsukamoto et al. | 385/14 |
| 2002/0196997 A1* | 12/2002 | Chakravorty et al. | 385/14 |
| 2005/0089264 A1* | 4/2005 | Johnson et al. | 385/15 |

FOREIGN PATENT DOCUMENTS

| | | |
|---|---|---|
| JP | 2004-163914 | 6/2004 |
| JP | 2004-334189 | 11/2004 |
| JP | 2004-341454 | 12/2004 |
| JP | 2004-347811 | 12/2004 |
| JP | 2005-017394 | 1/2005 |
| JP | 2005-148129 | 6/2005 |

OTHER PUBLICATIONS

English language abstract of JP 2005-017394.
English language abstract of JP 2004-163914.
English language abstract of JP 2004-341454.
Japanese Office Action issued with respect to patent family member Japanese Patent Application No. 2005-272653, dated Jan. 25, 2011, along with an English language outline thereof.

* cited by examiner

*Primary Examiner* — John A. McPherson
(74) *Attorney, Agent, or Firm* — Greenblum & Bernstein, P.L.C.

(57) ABSTRACT

In a method for forming a photoelectric composite board (10) on which a photoelectric transducer (5) is mounted, photomasks (111, 112, 113) which are used in processes to form the photoelectric composite board (10) are respectively disposed on the basis of a reference mark (33) previously formed on a metal thin film (101). In addition, openings (22) are formed on solder resist layers (8) by irradiating laser beams at positions defined on the basis of a reference point (4*a*) defined above a light deflector (4) formed on an end of a light guide (3).

8 Claims, 7 Drawing Sheets

METHOD FOR FORMING PHOTOELECTRIC COMPOSITE BOARD

BACKGROUND OF THE INVENTION

1. Field of the Invention

The present invention relates to a method for forming a photoelectric composite board which has an optical circuit and an electric circuit, and especially relates to a method for forming the photoelectric composite board by which a photoelectric transducer can be mounted on a photoelectric composite board simply in a high precision.

2. Description of the Related Art

According to rapid progress of wider bandwidth of a communication infrastructure and significant improvement of data processing capacity of a microcomputer and so on, it is needed to provide a data processing circuit having a very fast data transmission speed. Under such a circumstance, data communication by optical signals is considered as a means to exceed a limit of data transmission speed by electric signals, so that a photoelectric composite board, in which an optical circuit is mounted on an electric circuit such as a printed circuit board, is developed. An optical coupler such as a light deflector or grating is formed on the photoelectric composite board, and a photoelectric transducer such as a laser diode or a photodiode is mounted on electrode pads on the photoelectric composite board. Signals are transmitted between the optical circuit and the electric circuit through the optical coupler.

The electrode pads on which the photoelectric transducer is mounted are generally formed by the same method as that to form electrode pads of the printed circuit board to which electronic elements are mounted. More specifically, in a conventional method for forming the photoelectric composite board, electric circuits and electrode pads are formed on a surface of the circuit board with using normal photoresist processes, and a photo-mask is aligned on the circuit board on the basis of a reference point provided on the circuit board. Subsequently, solder resist layers such as UV-hardening resin films are formed on outer peripheries of mounting lands corresponding to the photo-mask, so that electrode pads on which the photoelectric transducer is mounted, consequently.

However, when the photoelectric transducer is mounted on the electrode pads formed by the above mentioned conventional process, center of light emitting portion or a light receiving portion of the photoelectric transducer to be mounted is displaced due to contraction of resin or contraction of the circuit board made of a resin generated in a heating process for forming a light guide or displacement of the photo-mask in alignment thereof. Thus, it is difficult to mount the photoelectric transducer at a position accurately so that light can enter into or exit from the light guide effectively.

JP 2005-17394 A discloses a method to mount a photoelectric transducer on a circuit board accurately by forming circuits through processes of aligning a mask-patter on the basis of a positional relation between a light deflector and a positioning mark previously formed on a circuit board and forming solder resist layers. The circuits, however, are formed with using the photo-mask, so that the displacement of the photo-mask itself occurs, and thus, it is difficult to form the electrode pads for photoelectric transducer accurately. Consequently, a disagreement of several tens µm between optical axes is generated when light emitted from the photoelectric transducer enters into a light deflector or light exit from the light deflector enters into the photoelectric transducer. A large amount of leakage loss of signals in transform between an optical circuit and an electric circuit occurs.

SUMMARY OF THE INVENTION

The present invention is conceived to solve the above mentioned conventional problem that positional displacement of the electrode pads for the photoelectric transducer that occurs in the process of forming the solder resist layers with using the photo-mask, and an object of the present invention is to provide an improved method for forming a photoelectric composite board that enables to align an optical axis of a photoelectric transducer with an optical axis of light deflector in a high accuracy and to realize a coupling between an optical circuit and an electric circuit in a high efficiency through a passive alignment.

A method for forming a photoelectric composite board in accordance with an aspect of the present invention comprises the steps of:

forming a light guide layer having a light guide with a light deflector on a metal thin film;

forming mounting lands on a surface of the light guide layer;

forming solder resist layer on the surface of the light guide layer so as to cover the mounting lands;

setting a reference point on the surface of the light guide layer just above the light deflector;

defining coordinates of centers of electrode pads to which an photoelectric transducer is mounted with respect to the reference point on the solder resist layer so as to overlap a center of a light emitting portion or a light receiving portion of the photoelectric transducer on the light deflector when the photoelectric transducer is mounted on the photoelectric composite board; and forming openings on the solder resist layer on a basis of defined coordinates so that a part of each the mounting land is exposed, and thereby, the electrode pads to which the photoelectric transducer is mounted are formed.

According to such a method, the electrode pads on the photoelectric composite board to which the photoelectric transducer is mounted are formed by exposing a part of each the mounting land, and the positions of the openings are precisely positioned on the basis of the coordinates defined with respect to the reference point on the surface of the light guide layer just above the light deflector. In other words, the positions of the openings on the solder resist layer are directly defined on the basis of the reference point above the light deflector without using a photo-mask, so that the positions of the electrode pads with respect to the light deflector includes no error component due to positioning the photo-mask. When the photoelectric transducer is mounted on the photoelectric composite board, the center of the light emitting portion or the light receiving portion of the photoelectric transducer overlaps on the light deflector, so that a coupling between an optical circuit and an electric circuit can be realized in a high efficiency.

In the above mentioned method, it is preferable that the step of defining the coordinates of the centers of the electrode pads is performed by using coordinates of centers of electrode pads of the photoelectric transducer to which solder bumps are formed with respect to the center of the light emitting portion or the light receiving portion of the photoelectric transducer, previously defined.

According to such a modification, the positional relations between the centers of the electrode pads of the light guide layer with respect to the reference point can correspond to positional relations between the centers of electrode pads with respect to the center of the light emitting portion or the light receiving portion and of the photoelectric transducer.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein.

DETAILED DESCRIPTION OF THE EMBODIMENT

A method for forming a photoelectric composite board in accordance with an embodiment of the present invention is described with reference to the figures.

Figure 1:
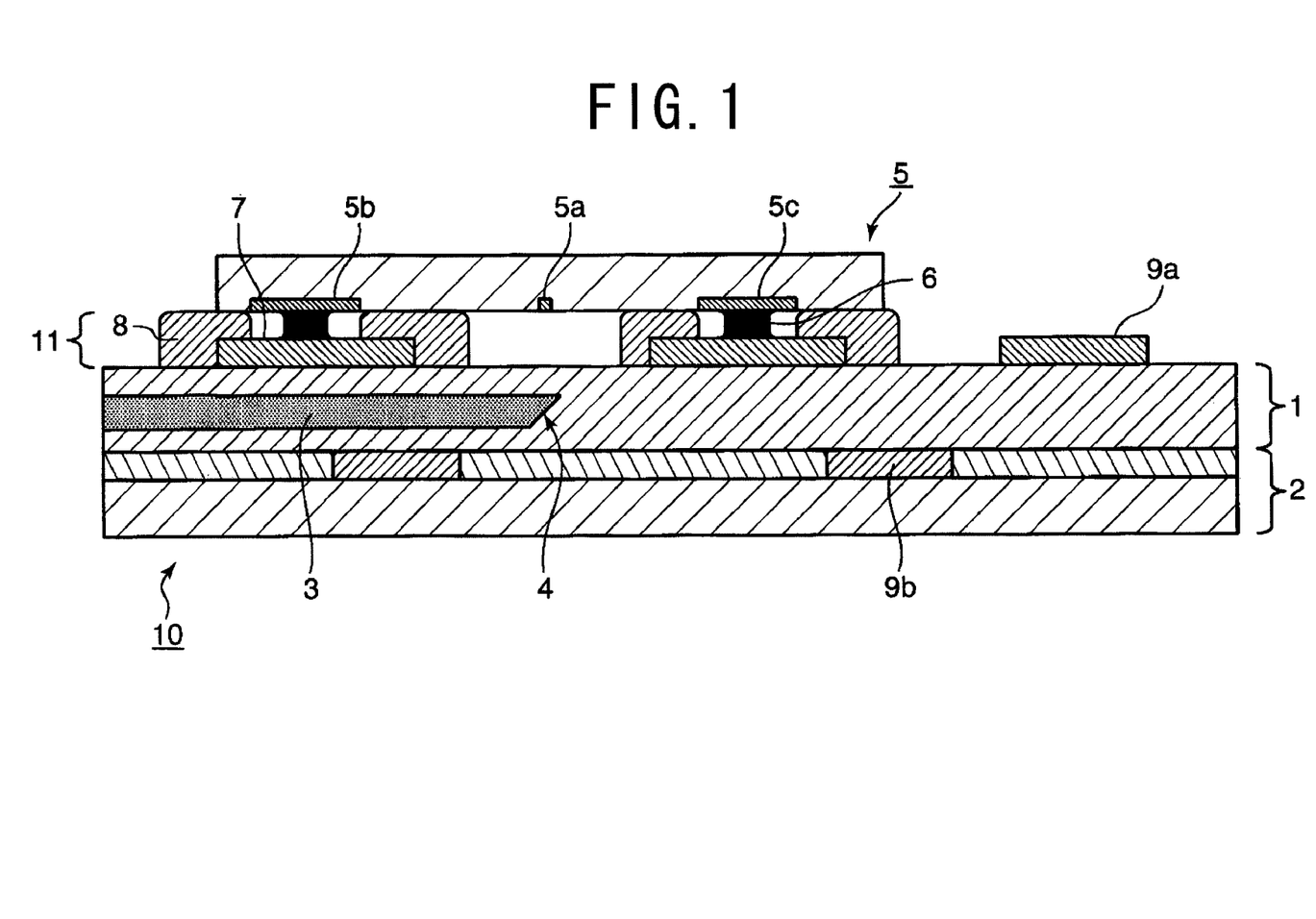
FIG. 1 is a cross-sectional side view showing a configuration of a photoelectric composite board on which a photoelectric transducer is mounted.

FIG. 1 shows a configuration of an example of a photoelectric composite board 10 which is to be formed by the method in accordance with the present invention. The photoelectric composite board 10 comprises a light guide layer 1 including a light guide 3, and an electric circuit layer 2 having a conductive pattern of an electric circuit 9b formed thereon. Electrode pads 11 each further comprising mounting lands 7, solder resist layers 8 and solder bumps 6 are formed on a surface of the light guide layer 1. A conductive pattern of another electric circuit 9a is further formed on the surface of the light guide layer 1. A photoelectric transducer 5 having a light emitting portion or a light receiving portion 5a and electrode pads 5b and 5c for solder bumps is mounted on the electrode pads 11 so that the photoelectric transducer 5 is mounted on the photoelectric composite board 10. A light deflector 4 is formed on an end of the light guide 3 facing the light emitting portion or the light receiving portion 5a of the photoelectric transducer 5.

When the photoelectric transducer 5 is a light emitting device such as a laser diode or a light emitting diode, light generated by the light emitting device is emitted from the light emitting portion 5a. Alternatively, when the photoelectric transducer 5 is a light receiving device such as a photodiode or a phototransistor, light exit from the light deflector 4 of the light guide 3 enters into the light receiving device through the light receiving portion 5a. The electrode pads 5b and 5c for solder bumps are formed on the photoelectric transducer 5 on which solder bumps are further formed. The photoelectric transducer 5 is connected to the electric circuit 9a, for example, so that electric signals from the electric circuit are transformed to optical signals to an optical circuit or optical signals from the optical circuit are transformed to electric signals to the electric circuit.

The method for forming the photoelectric composite board in accordance with this embodiment of the present invention is mainly based on a conventional method, for example, shown in JP 2004-341454 or JP 2004-163914 except the following processes for forming electrode pads on which the photoelectric transducer is mounted. Hereinafter, the electrode pads on which the photoelectric transducer is mounted are abbreviated as "electrode pads for photoelectric transducer".

Figure 2A:
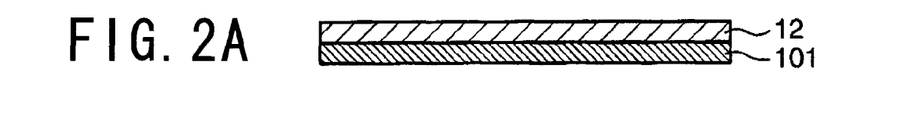
FIGS. 2A to 2H are cross-sectional side views respectively showing processes for forming the photoelectric composite board in accordance with an embodiment of the present invention.

Subsequently, processes for forming the light guide layer 1 is described with reference to FIGS. 2A to 2F. As shown in FIG. 2A, a first transparent layer 12 of a transparent material is formed on a metal thin film 101. As for the metal thin film 101, a copper film, an aluminum film, a nickel film or the like each having a thickness from 9 to 70 μm can be used. At this time, it is preferable to form a reference mark 33 (see FIG. 4, for example) on the metal thin film 101 which is used as a reference for aligning photo-masks described below.

In the process to form the first transparent layer 12 on the metal thin film 101, it is preferable to fix the metal thin film 101 on a support of a rigid body such as a metal plate, a resin plate, a ceramic plate by an adhesive or the like so that the metal thin film 101 with the first transparent layer 12 formed on a surface opposite to the face fixed on the support can be peeled off from the support. By using such a support, handleability of the metal thin film 101 with the first transparent layer 12 can be increased.

As for a method for forming the first transparent layer 12, a light-hardening resin or a thermo-hardening resin such as varnish is spread on the metal thin film 101, and the light-hardening resin or the thermo-hardening resin is hardened by irradiating a light such as ultraviolet light or applying a heat thereto. The transparent material for the first transparent layer 12 is not limited to varnish. Various materials including inorganic materials such as $SiO_2$, $Al_2O_3$, and organic materials such as acrylic resin, polycarbonate resin, epoxy resin, polyimide resin can be used as the material of the first transparent layer 12. As for a method to spread varnish on the metal thin film 101, spin coat method, roll transfer printing, or spraying can be used. In particular, the roll transfer printing or spin coat method is preferable to spread varnish evenly in thickness.

Figure 2B:
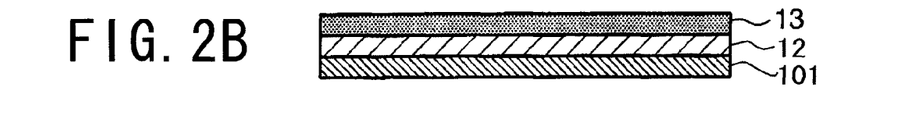

Subsequently, light-hardening material such as varnish is spread on a surface of the first transparent layer 12 to form a second transparent layer 13 on which the light guide 3 is formed, as shown in FIG. 2B. As for a material for forming the second transparent layer 13, although various transparent materials similar to the materials for the first transparent layer 12 can be used, it is necessary that a refraction index of the transparent material of the second transparent layer 13 after hardening is different from that of the material of the first transparent layer 12. Since the light guide layer 1 must have transparency in spectrum of light to be transmitted therethrough, it is generally configured by a high index material layer having a refraction index higher than a low index material layer. When light beams enter into the high index layer, that is, the light guide 3, a part of the light beams which satisfy requirements of total reflection on a boundary between the high index layer and the low index layer are reflected 100%, so that the light beams satisfying the requirements are closed in the light guide 3 made of a material having the higher refraction index. Therefore, the light guide 3 is formed of a material having a refraction index higher than that of the portion other than the light guide 3 in the light guide layer 1, light beams can be transmitted to a desired direction.

Figure 2C:
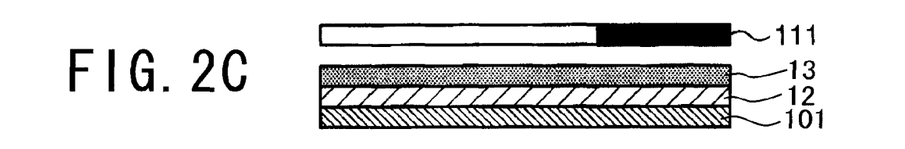
Figure 2D:
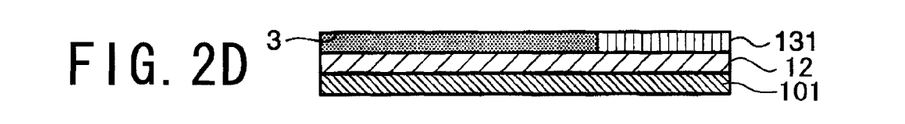

For example, when a light-hardening resin such as a varnish is used as a material of the second transparent layer 13, it is spread on a surface of the first transparent layer 12. Then, after dehydrating the varnish spread on the surface of the first transparent layer 12 by heating, a photo-mask 111 having a slit formed at a position corresponding to the light guide 3 is disposed to face a layer of the dehydrated varnish layer, that is, the second transparent layer 13, as shown in FIG. 2C. When light beams such as ultraviolet rays are irradiated on the photo-mask 111, the light beams pass through the slit of the photo-mask, so that only a portion of the second transparent layer 13 (dehydrated varnish) facing the slit at which the light guide 3 is to be formed is hardened, as shown in FIG. 2D. In FIG. 2D, the hardened portion of the second transparent layer 13 is designated by numeral 3 and a portion of the second transparent layer 13 not hardened is designated by numeral 131 for the purpose of the convenience.

At this time, it is preferable to paste a transparent protection sheet such as PET sheet on a surface of the second transparent layer 13 according to need. Since the protection sheet has transparency, the photo-mask 111 can be contacted to the protection sheet directly for exposing the second transparent layer 13 by the light beams. The protection sheet is removed after hardening the portion of the second transparent layer 13 corresponding to the light guide 3. In addition, the photo-mask 111 is aligned on the second transparent layer 13 by aligning the reference mark 33 previously provided on the photo-mask 111 on the basis of the reference mark 33 provided on the metal thin film 101.

Figure 2E:
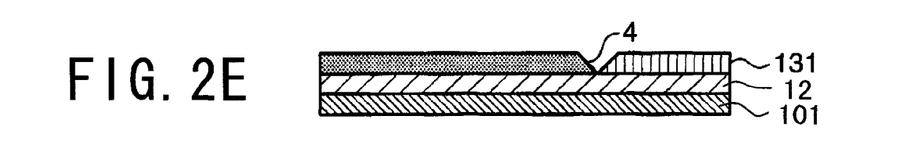

Subsequently, the light deflector 4 is formed on the light guide 3, as shown in FIG. 2E. The light deflector 4 has a function to deflect a moving direction of light emitted from the photoelectric transducer 5 to a direction to move into the light guide 3 or to deflect a moving direction of light transmitted in the light guide to a direction to enter into the photoelectric transducer 5. The light deflector 4 is generally formed to have an inclination angle of 45 degrees with respect to an optical axis of the light guide 3, so that the light emitted from the photoelectric transducer 5 reflects substantially at right angle to proceed into the light guide 3, for example.

Method for forming the light deflector 4 is not limited in particular. Various methods such as a method using a dicing cutter, a UV laser ablation, or a transfer method using a die can be used to cut the second transparent layer 13 to have a V-shaped section.

In addition, it is preferable to form a metal thin coating on a surface of the light deflector to increase reflection coefficient. As for a method to form the metal thin coating, a paste including metal particles such as a silver paste is spread on an outer surface of the light deflector 4 with using a printing process, or a metal coating is deposited on the outer surface of the light deflector 4 by vapor deposition or sputtering of a metal. As for a metal material of the metal particles, silver, gold, aluminum, and so on having a high reflection coefficient is preferable.

Subsequently, the portion 131 of the second transparent layer 13 which is not hardened by irradiation of light beams through the photo-mask 111 is removed by washing of solvent. The solvent used for removing the portion 131 not hardened is not limited in particular, if it can solve the material of the second transparent layer 13 not hardened.

Figure 2F:
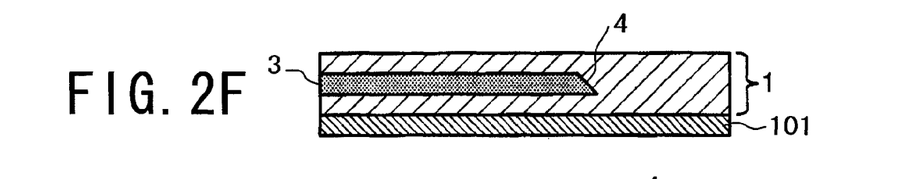

After removing the portion 131 not hardened from the surface of the first transparent layer 12, a transparent material which is the same as that of the first transparent layer 12 is further spread on the surface of the first transparent layer 12 to enclose the light guide 3 with the light deflector 4, so that the light guide layer 1 is formed, as shown in FIG. 2F.

Figure 2G:
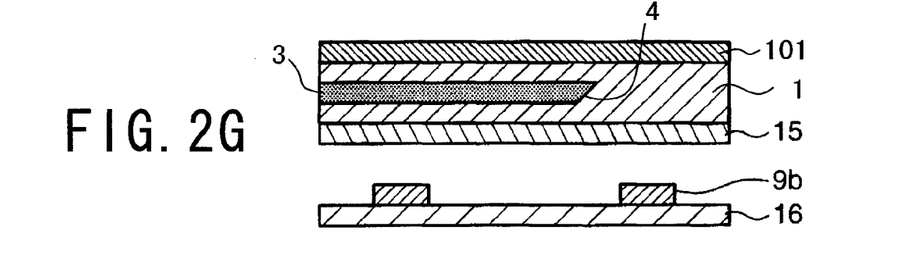

Subsequently, a production of lamination of the light guide layer 1 and the metal thin film 101 are turned upside down, as shown in FIG. 2G. Then, an adhesive layer 15 is spread on a bottom surface of the light guide layer 1 opposite to the metal thin film 101, and an electric circuit board 16 with the electric circuit 9b is attached on the bottom face of the light guide layer 1 by the adhesive layer 15, as show in FIG. 2H.

Figure 2H:
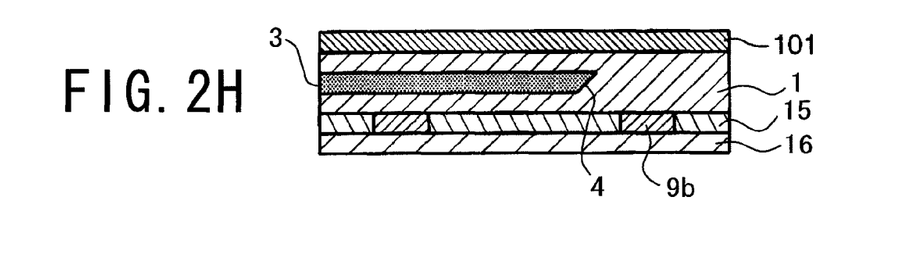

As for the adhesive layer 15, a prepreg used for forming a printed circuit board is nipped between the light guide layer 1 and the electric circuit board 16, and they are adhered by laminate molding process. Alternatively, single component or two-component type epoxy adhesive, or acrylic adhesive can be spread between the light guide layer 1 and the electric circuit board 16, and pressure and heat are applied to harden the adhesive.

Although structure of the electric circuit boar 16 is not limited in particular, it is preferable to have one or more electric circuit is formed on a surface and/or inside of the board so as to realize a high-density photoelectric composite board.

Subsequently, a conductive pattern of the electric circuit 9a and mounting lands are formed at predetermined positions on the surface of the light guide layer 1 by etching the metal thin film 101 with using known photoresist processes.

Figure 3A:
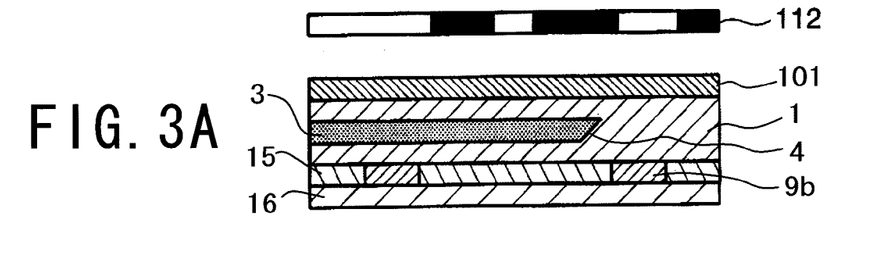
FIGS. 3A to 3F are cross-sectional side views respectively showing subsequent processes for forming the photoelectric composite board in accordance with an embodiment of the present invention.
Figure 3B:
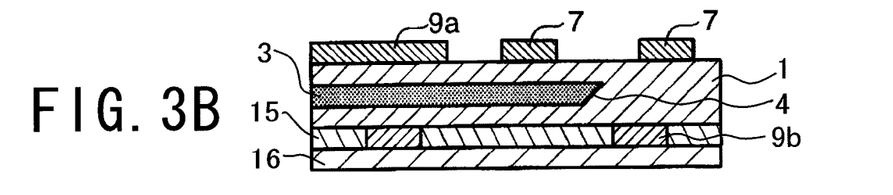

A photosensitive resist is spread on a surface of the metal thin film 101, and a photo-mask 112 having a predetermined transparent patter is disposed to face the resist spread on the surface of the metal thin film 101, as shown in FIG. 3A. Then, light beams such as ultraviolet rays are irradiated on the photo-mask 112, and the resist is developed so that a predetermined pattern of a resist film is formed on the metal thin film 101. By etching the metal thin film 101 with the resist film, the electric circuit 91 and the mounting lands 7 are formed on the light guide layer 1, as shown in FIG. 3B.

Figure 4:
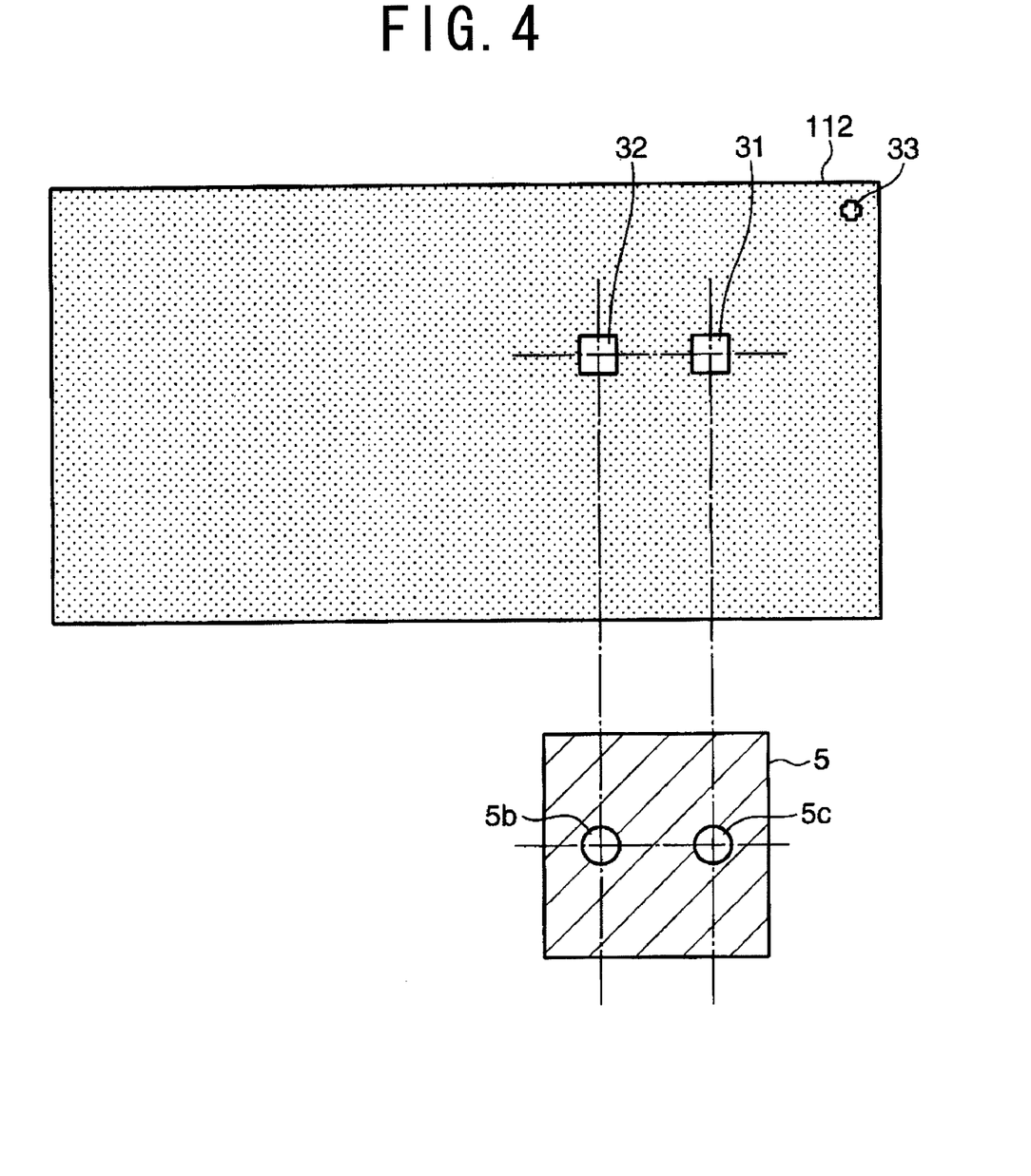
FIG. 4 is a plane view showing a positional relation between centers of openings which are used to form mounting lands and a positional relation between centers of electrode pads of the photoelectric transducer.

As shown in FIG. 4, it is desirable that a positional relation between centers of openings 31 and 32 which are used to form the mounting lands 7 corresponds to a positional relation between centers of the electrode pads 5b and 5c for solder bumps of the photoelectric transducer 5. Hereupon, since the shapes and sizes of the mounting lands 7 on which the photoelectric transducer 5 is mounted are precisely defined by the openings 31 and 32 of the photo-mask 112, it is possible to form the mounting lands 7 as large as possible in an area where an insulation between the adjoining two mounting lands 7 or between the mounting land 7 and the electric circuit 9a can be secured, because a tolerance for adjusting the position of the photoelectric transducer 5 with respect to the mounting lands 7 becomes larger. Specifically, it is preferable that a distance between the adjoining two mounting lands 7 or between the mounting land 7 and the electric circuit 9a is more than 20 μm so as to secure the insulation. In addition, the reference mark 33 is preferably formed at a position differ from the openings 31 and 32 so as not to interfere the mounting processes of the photoelectric transducer 5.

Figure 5:
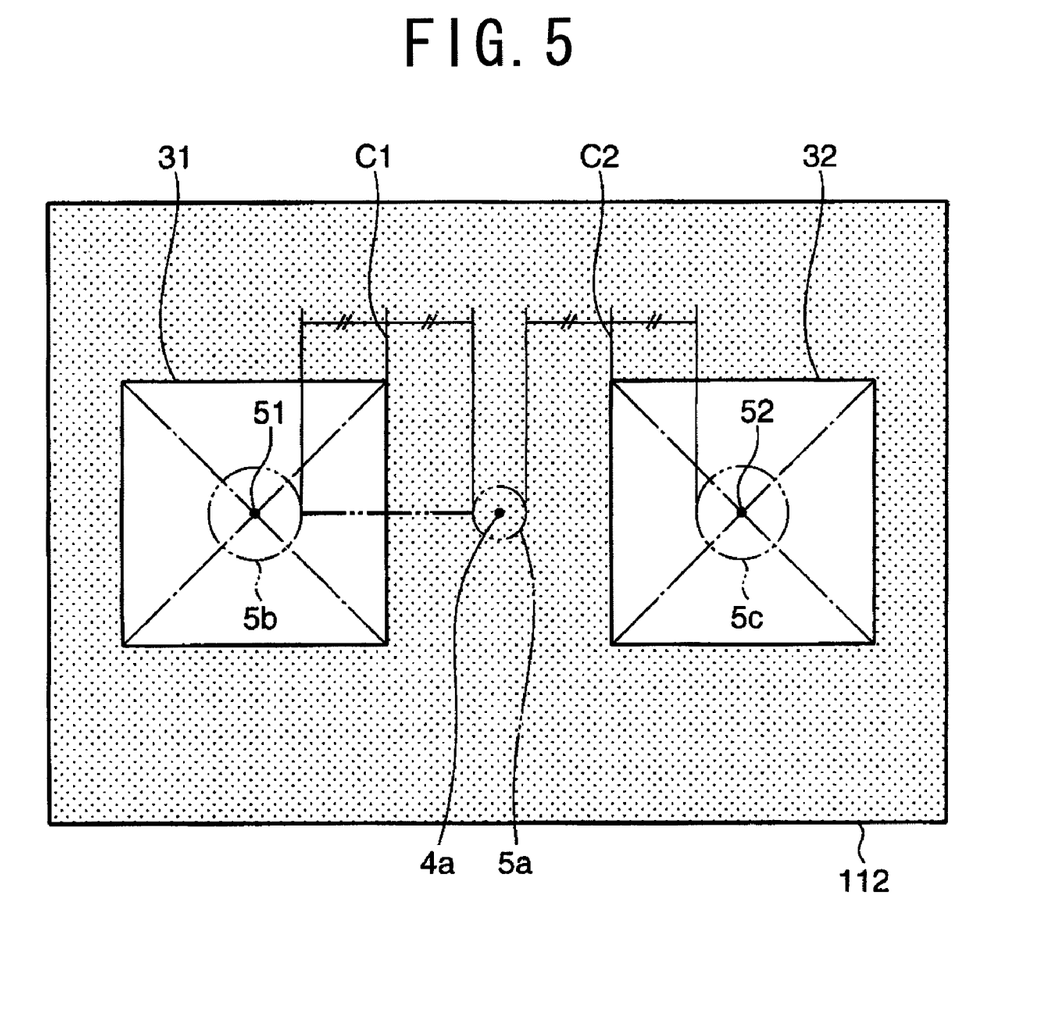
FIG. 5 is a plain view showing a pattern of a photo-mask used to form the mounting lands.

In addition, the mounting lands 7 near to the light deflector 4 in the light guide layer 1 should be defined as larger as possible in an area not to overlap the light deflector 4 in a direction binding a reference point 4a disposed above the light deflector 4 and the centers of the mounting lands 7, as shown in FIG. 5. Specifically, it is assumed that centers 51 and 52 of the electrode pads 5b and 5c for solder bumps and centers of the openings 31 and 32 are precisely aligned each other, and the light emitting portion or the light receiving portion 5a of the photoelectric transducer 5 and the reference point 4a on the photo-mask 112 which overlaps the reference point of the light deflector 4 when the photo-mask 112 is aligned on the light guide layer 1 are precisely aligned. Under such assumption, outlines of the electrode pads 5b and 5c for solder bumps and an outline of the light emitting portion or the light receiving portion 5a are respectively illustrated as circles two-dotted chain lines, and outlines of the openings 31 and 32 are illustrated as squares by solid lines in FIG. 5. Segments c1 and c2 respectively binds the shortest distances between the outlines of the electrode pads 5b and 5c for solder bumps and the light emitting portion or the light receiving portion 5a. The outlines of the openings 31 and 32 can be enlarged to substantially the centers of the segments c1 and c2 in the direction binding the centers of the openings 31 and 32. One or a plurality of mounting lands 7 is formed corresponding to a number of solder bumps formed on the photoelectric transducer 5.

The photo-mask 112 is formed so that the center of the light emitting portion or the light receiving portion 5a is aligned to the center of the light deflector 4 when the centers of the mounting lands 7 and the centers 51 and 52 of the electrode pads 5b and 5c for solder bumps of the photoelectric transducer 5 to be mounted are superimposed. In addition, the photo-mask 112 is aligned to the metal thin film 101 so that the reference marl of the photo-mask 112 is aligned with the reference mark previously formed on the metal thin film 101.

Figure 3C:
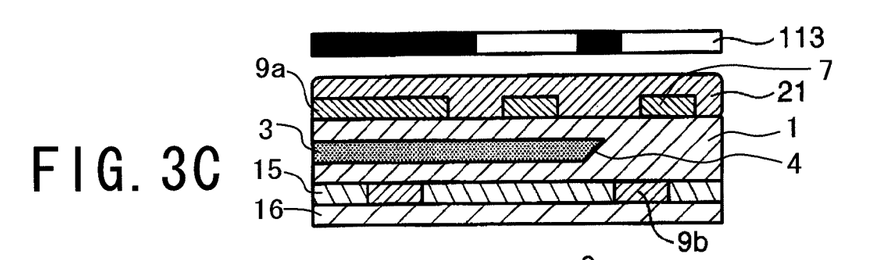

Subsequently, the electric circuit 9a and the mounting lands 7 are coated by a resin layer 21 in which solder resists will be formed, as shown in FIG. 3C. As for a material of the resin layer 21, various types of hardening resin such as a light-hardening epoxy resin which are conventionally used for solder resist in a field of printed circuit board can be used. Specifically, a two component type light-hardening resin DSR-2200KP 19 (TAMURA KAKEN CORPORATION) or SR9000W (Hitachi Chemical Company, Ltd) can be used.

Figure 3D:
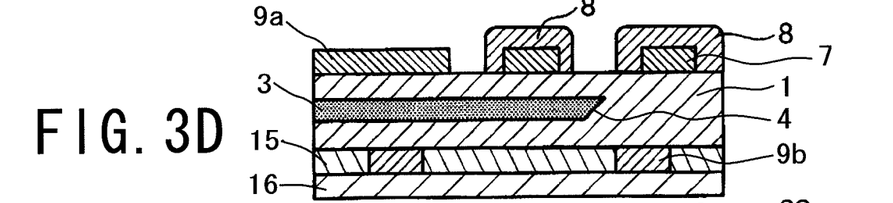

A photo-mask 113 having a pattern to expose the portions to which solder resist layers 8 are formed is disposed to face the resin layer 21, as shown in FIG. 3C, and thus, the solder resist layers 8 are formed on the light guide layer 1 to cover the mounting lands, as shown in FIG. 3D by the conventionally known processes such as printing process, or photographic processes. The photo-mask 113 is also aligned on the resin layer 21 by aligning a reference mark previously formed on the photo-mask 113 with the reference mark 33 previously formed on the metal thin film 101 which is remained on the surface of the light guide layer 1 after etching the metal thin film 101. Subsequently remained portions of the resin layer 21 which are not exposed and not hardened due to the photo-mask 113 are removed by washing of an alkaline developer such as solution of $Na_2Co_3$, as shown in FIG. 3D.

A thickness of the solder resist layers 8 formed by the above mentioned processes are about 10 to 40 μm, and more preferable, it should be 10 to 20 μm. If the thickness of the solder resist layers 8 is too thin, airspaces such as pinholes may occur in the solder resist layers 8. Alternatively, if the thickness of the solder resist layers 8 is too thick, a depth of openings which will be formed on the solder resists described later becomes deeper, so that error components may occur in the openings.

Subsequently, processes for forming the electrode pads 11 for mounting the photoelectric transducer 5 are described. At first, coordinates of centers of the electrode pads 11 with respect to the reference point 4a above the light deflector 4 are specified on the solder resist layers 8 on the basis of the positional relation between the center of the light emitting portion or the light receiving portion 5a and the electrode pads 5b and 5c for solder bumps of the photoelectric transducer 5.

Figure 6A:
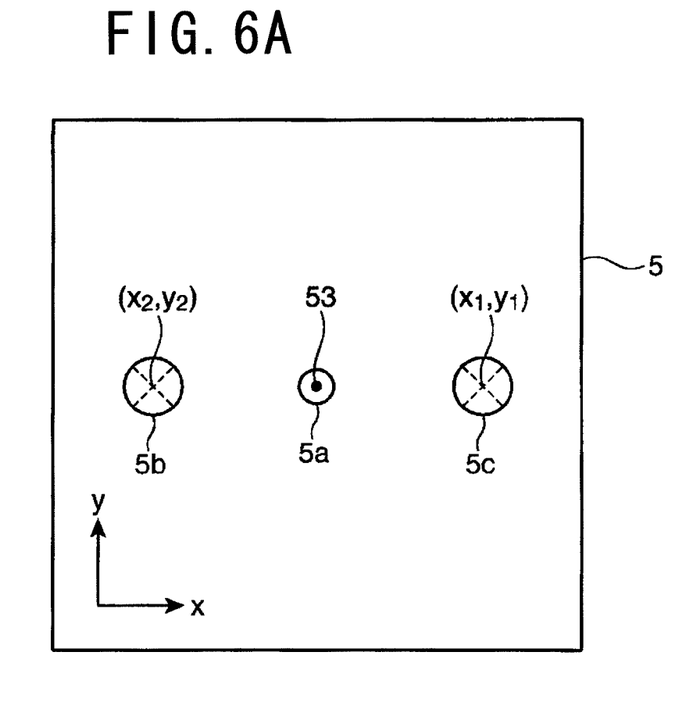
FIG. 6A is a plain view showing an arrangement of electrode pads for solder bumps of the photoelectric transducer to be mounted on the photoelectric composite board.
Figure 6B:
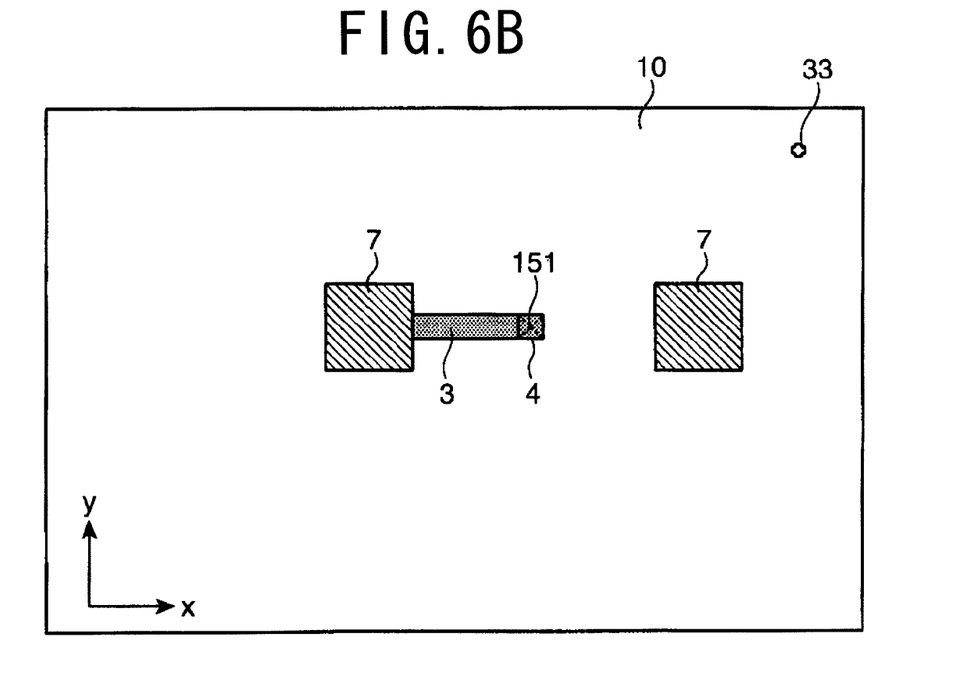
FIG. 6B is a plain view showing an arrangement of the mounting lands, a light guide and a light deflector provided on the photoelectric composite board.

FIG. 6A schematically shows an arrangement of the light emitting portion or the light receiving portion 5a and the electrode pads 5b and 5c for solder bumps of the photoelectric transducer 5 to be mounted on the photoelectric composite board 10. FIG. 6B schematically shows an arrangement of the mounting lands 7, the light guide 3 and the light deflector 4 on the photoelectric composite board 10. In FIGS. 6A and 6B, the conductive patterns of the electric circuits 9a and 9b are omitted for simplicity.

As shown in FIG. 6A, two-dimensional coordinates ($x_n$, $y_n$), when defining the center 53 of the light emitting portion or the light receiving portion 5a as the origin, are applied to the centers of the electrode pads 5b and 5c for solder bumps. Hereupon, symbols "n" designates a number applied to each electrode pad 5b, 5c . . . . FIG. 6A shows the example that only two electrode pads are provided. When more accurate mounting of the photoelectric transducer is required, it is preferable to apply three-dimensional coordinates to each electrode pads. Application of coordinates to the electrode pads is preferably performed by experimental measurement through a toolmaker's microscope or a three-dimensional sizer comprising at least an optical microscope, a CCD camera and a table stage which enables to measure and define two-dimensional coordinates. When the dimensional accuracy of the photoelectric transducer 5 is higher, the two-dimensional coordinates of the electrode pads 5b and 5c for solder bumps with respect to the center 53 of the light emitting portion or the light receiving portion 5a can be obtained from design values of the photoelectric transducer 5.

Subsequently, a reference point is set on the photoelectric composite board 10 above the light deflector 4. Since the light deflector 4 can be observed from a side of the photoelectric composite board 10 to which the photoelectric transducer 5 is mounted (hereinafter, it is abbreviated as "from the upper side"), it is possible to set the reference point on an upper surface of the photoelectric composite board 10 with using the toolmaker's microscope or the three-dimensional sizer from the upper side.

Since the light deflector 4 is formed to have an inclination angle of 45 degrees with respect to an optical axis of the light guide 3, when the cross-sectional shape of the optical guide 3 perpendicular to the upper surface of the photoelectric composite board 10 is rectangular, a projection of the light deflector 4 on the upper surface of the photoelectric composite board 10 becomes a rectangular shape, as shown in FIG. 6B. Therefore, the reference point can be selected among the center of gravity, apexes, the intersection of diagonal lines, the midpoint of each side of the projection of the light deflector 4, or an ideal point calculated by a geometric calculation. The reference point, however, is not limited to the above listing, and it is possible to be an optional point just above the light deflector 4 which can be specified. Then, coordinates showing positional relation between the center of the light emitting portion or the light receiving portion 5a and the centers of the electrode pads 5b and 5c for solder bumps of the photoelectric transducer 5 from the reference point specified on the upper surface of the photoelectric composite board 10 above the light deflector 4 are specified on the solder resist layers 8.

More specifically, the intersection of diagonal lines of the rectangular projection of the light deflector 4 on the upper surface of the photoelectric composite board 10 is specified as the reference point 151 as shown in FIG. 6B. Subsequently, coordinates of the center of each electrode pad 5b, 5c with respect to the reference point 151 are specified. In addition, the coordinates are specified so that the center of the light emitting portion or the light receiving portion 5a laps over the reference point 151, and the electrode pads 5b and 5c on the photoelectric transducer 5 lap over the mounting lands 7 which are covered by the solder resist layers 8 formed to correspond to the electrode pads 5b and 5c for solder bumps.

Figure 3E:
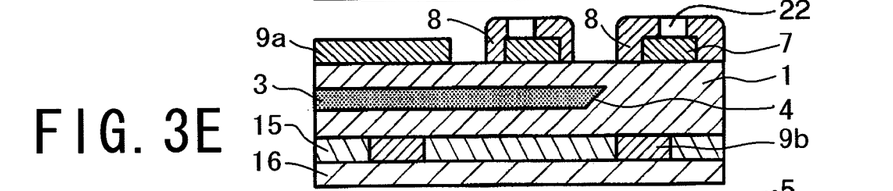

After specification of the coordinates of the centers of the electrode pads 5b and 5c for solder bumps with respect to the reference point 151, openings 22 are formed on the solder resist layers 8 in the vicinities of the specified coordinates, as shown in FIG. 3E. Consequently, the electrode pads 11 to be used for mounting the photoelectric transducer 5 are precisely formed on the photoelectric composite board 10.

The openings 22 can be formed with using an NC (Numerical Control) machine which comprises an observation device such as a CCD camera and a memory to memorize the coordinates and precisely works a portion of an object specified by the coordinates precisely, for example. Machining accuracy of the NC machine is preferably equal to or smaller than 10 μm in view of allowable positioning error for effectively emits light from or enters light into the light emitting portion or the light receiving portion 5a of the photoelectric transducer 5.

Since processes to form the openings 22 are not limited in particular, processes to evaporate the solder resist layers 8 with laser beams, or processes to cut the solder resist layers 8 mechanically can be adopted. It, however, is preferable to use the laser beams because it has a higher machining accuracy and it may not apply unwanted mechanical stress to the photoelectric composite board 10. As for the laser device using to evaporate the solder resist layers 8, a UV (ultraviolet) laser which is typified by an excimer laser such as KrF or ArF, or an IR (infra-red) laser which is typified by Nd-YAG laser or $CO_2$ laser can be used.

Although the mechanical stress may be applied, the solder resist layers 8 can be cut away by mechanical drilling. In such a case, it is preferable to form a front end of the drill flat and to have a diameter corresponding to the diameter of the opening 22. In addition, so as not to damage the metal thin film 101, it is preferable to control the depth of cutting less than 1 μm.

Most preferable diameter of the openings 22 to be formed as above cannot be specified in general, because it is decided by the sizes of the electrode pads for solder bumps 5b and 5c of the photoelectric transducer 5 to be mounted on the photo electric composite board 10. It, however, is preferable to form the openings 22 to have a dimension larger or smaller about 5% with respect to the diameter of the electrode pads 5b and 5c for solder bumps of the photoelectric transducer 5. If the sizes of the openings 22 and the electrode pads 5b and 5c largely differ from each other, shapes of solders between the electrode pads 11 and the electrode pads 5b and 5c after reflow processing become irregular, and thus, positional relations between the centers of the electrode pads 11 and the electrode pads 5b and 5c may be discrepant.

Figure 3F:
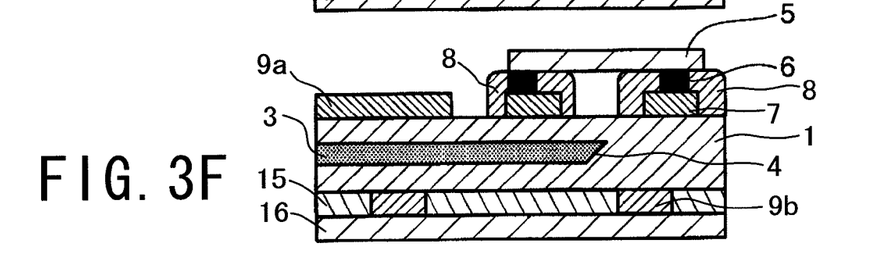

The photoelectric transducer 5 is mounted on the photoelectric composite board 10 by the following processes. The solder bumps 6 are previously formed on the electrode pads 5b and 5c of the photoelectric transducer 5. Then, the photoelectric transducer 5 is disposed on the upper surface of the photoelectric composite board 10 so that the solder bumps 6 face the corresponding electrode pads 11, and the photoelectric composite board 10 with the photoelectric transducer 5 is put into a reflow oven so as to reflow the solder bumps 6, as shown in FIG. 3F.

According to form the electrode pads 11 to which the photoelectric transducer 5 is mounted on the basis of the reference point above the light deflector 4, the photoelectric composite board 10 on which the photoelectric transducer 5 can be precisely mounted is obtained. Since the electrode pads 11 for mounting the photoelectric transducer 5 are precisely formed on the photoelectric composite board 10, the photoelectric transducer 5 can be mounted on the photoelectric composite board 10 precisely at a position where photoelectric converting efficiency is higher. Consequently, the photoelectric composite board 10 with the photoelectric transducer 5 having a low light loss can be obtained. In addition, since the electrode pads 11 to which the photoelectric transducer 5 is to be mounted can be formed on the photoelectric composite board 10 in a manufacturing processes, it is possible to mount the photoelectric transducers 5 on the photoelectric composite boards 10 in the manufacturing processes without needing active alignment processes.

Subsequently, preferred examples of the method for forming the photoelectric composite board in accordance with the present invention are described below. In this example, a flip chip type vertical cavity surface emitting laser (VCSEL) (trade name "ULM850-05-TT-U101U" by ULM Photonics) was used as the photoelectric transducer 5. Emission wavelength of the VCSEL was 850 nm, and a current value actually measured was 3.2 mA to obtain an output of 1 mW. A diameter of light emitting portion was 10 μm. Circular electrode pads 61 and 62 each having a diameter of 50 μm (D50 Pad) as shown in FIG. 7 were used to form the solder bumps of the VCSEL.

Figure 7:
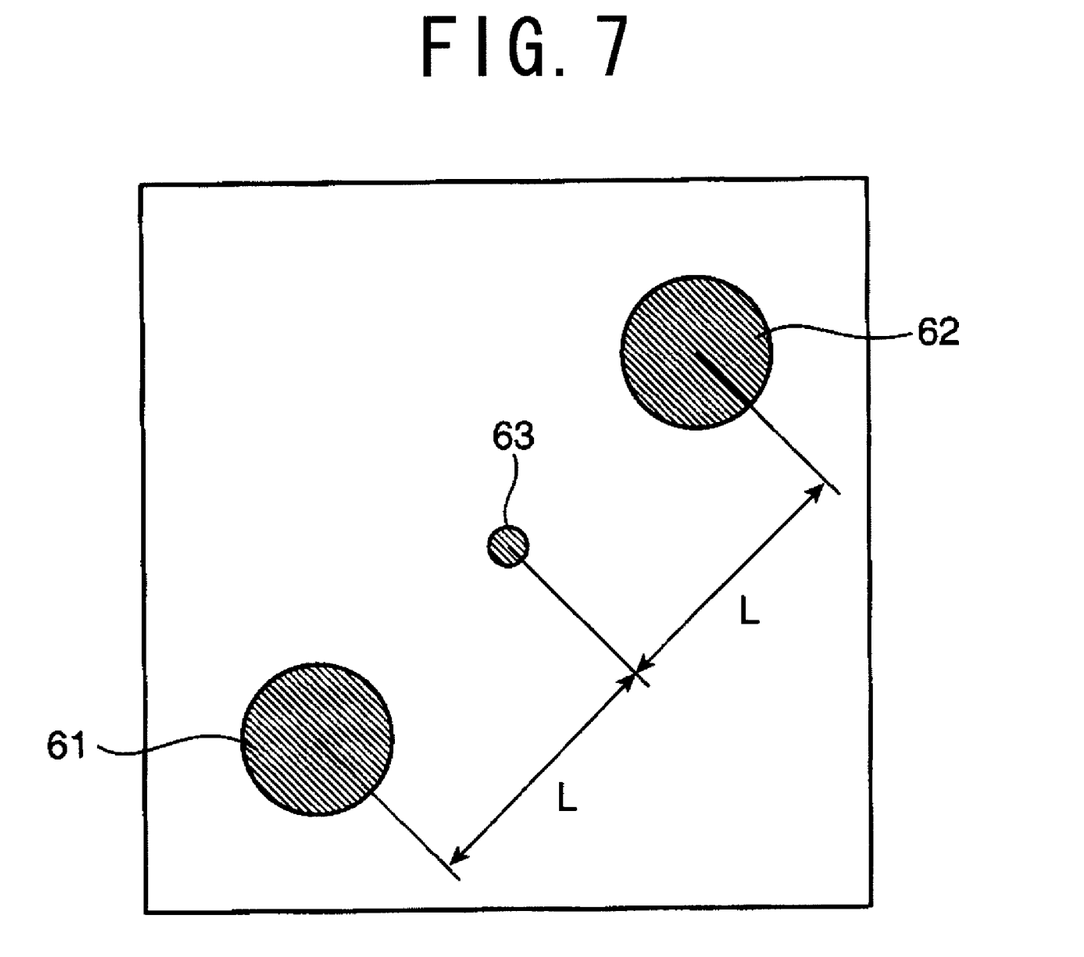
FIG. 7 is a plain view showing an arrangement of the electrode pads with respect to a light emitting portion of a VCSEL which was actually used in specific examples.

In addition, one side of outlines of the VCSEL was referred as abscissa, and a center of a light emitting portion 63 was defined as the origin (0, 0) in FIG. 7. Coordinates of a center of a circular electrode pad 61 was (−72.5, −72.5) and coordinates a center of a circular electrode pad 62 was (72.5, 72.5). These coordinates were measured in units of μ m. Distances to the centers of the electrode pads 61 and 62 from the center of the light emitting portion 63 were respectively 102.5 μm. These coordinates and distances were measured by MEASURING MICROSCOPE: MM-40 by Nikon Corporation.

FIRST SPECIFIC EXAMPLE

Hereinafter, a first specific example of the method for forming the photoelectric composite board in accordance with the present invention is described. At first, a photoelectric composite board having a light guide was formed by a method described in JP 2004-341454.

A transparent material "A" used in the following processes was a thermo-hardening epoxy resin consisting of a component having a trade name "BPAF-DGE" by Tohto Kasei Co. Ltd. 100 mass part, a component having a trade name "B650" by DAINIPPON INK AND CHEMICAL INCORPORATED 66 mass part, and a component having a trade name "SA-102" by SAN-APRO LIMITED. After heating the transparent material "A" an hour in 100 degrees Celsius and further heating an hour in 150 degrees Celsius, a refraction index of the transparent material "A" was 1.51.

A transparent material "B" was a vanish obtained by mixture of a component having a trade name "EHPE-3150" by DAICEL CHEMICAL INDUSTRIES, LTD. 100 mass part, a component of methyl ethyl ketone 70 mass part, a component of toluene 30 mass part, and a component having a trade name "Rhodesil Photo-initiator 2074" by Rodia Japan, LTD. 2 mass part. After removing a solvent by dehydrating the transparent material "B", hardening the transparent material "B" by irradiation of light with a high-pressure mercury vapor lamp having a power 10 J/cm$^2$, and curing an hour in 150 degrees Celsius, a refraction index of the transparent material "B" was 1.53.

A transparent material "C" was a vanish consisting of a component having a trade name "TDB500" by Tohto Kasei Co. Ltd. 90 mass part, a component having a trade name "YDCN-1211" by Tohto Kasei Co. Ltd. 10 mass part, a component of dicyandiamide 3 mass part, a component having a trade name "2E4MZ" by SHIKOKU CHEMICALS CORPORATION 0.1 mass part, a component of methyl ethyl ketone 30 mass part, and a component of dimethylformamide 8 mass part.

Subsequently, a copper film having a thickness 35 μm (trade name "MPGT" by THE FURUKAWA ELECTRIC CO. LTD.) was used as a metal thin film 101, the transparent material "A" was spread on the metal thin film 101 to have a thickness of 50 μm by roll transfer method, and the transparent material "A" was hardened by heating an hour in 100 degrees Celsius and further by heating an hour in 150 degrees Celsius, so that the first transparent layer 12 was formed.

Subsequently, the transparent material "B" was spread on the first transparent layer 12 to have a thickness of 80 μm, and a photo-sensitive second transparent layer 13 having a thickness of 40 μm was formed by heating and dehydrating the transparent material "B". After that, a cover film of a transparent PET film having a thickness of 25 μm was adhered on the second transparent layer 13, so that a laminated product was obtained. Them the laminated product was cut off into a square 60 mm on a side.

A photo-mask was aligned on the square laminated product on the basis of a reference mark 33 which was previously formed on the metal thin film. The reference mark was a cross-shape having a line width 100 μm and a line length 500 μm. The photo-mask had a score slits each having a line width of 40 μm, a line length 60 mm and arranged in parallel at an interval of 250 μm. Under contacting the photo-mask to the cover film of the laminated product, light was irradiated on the photo-mask with the high-pressure mercury vapor lamp having a power 10 J/cm$^2$, so that the photo-sensitive second transparent layer 13 was selectively hardened so as to form light guides 3.

After forming the light guides 3, a V-shaped groove was formed with using a rotary blade having an apex angle 90 degrees, so that the light deflector 4 is formed on each light guide 3. Specifically, a rotary blade #5000 (Model Number "B1E863SD5000L100MT38" by DISCO Corporation) was used. The rotary blade rotating in 30,000 rpm was contacted was contacted to a surface of the cover film of the laminated product at a position distant 5 mm from an end of the arranged score light guides 3 in an anteroposterior direction of the light guides 3, and the rotary blade was moved in a depth direction with a working speed 0.03 mm/s to a cutting depth 80 μm. Keeping such a cutting depth, the cutting blade was moved in a direction perpendicular to the arrangement of the light guides 3 with a moving speed 0.1 mm/s. The same processes were performed at a position distant 5 mm from the other end of the arranged score light guides 3 in an anteroposterior direction of the light guides 3, Consequently, light deflectors 4 were formed at both ends of each of the arranged score light guides 3 having a length of 50 mm. Surface roughness (rms: root mean square) of each light deflector 4, that is, the slanted end face of the light guide 3 due to the V-shaped groove was 60 nm.

Then, silver paste into which silver particles having a grain diameter equal to or smaller than 10 nm were dispersed was dropped on a surface of each end face of the light defector 4 and solvent was removed from the silver paste by heating an hour in 120 degrees Celsius, so that the surface of the light deflector 4 was coated by a metal film.

Subsequently, the cover film was peeled off from the laminated product, and the second transparent layer 13 was developed with an aqueous cleaning agent having a trade name "Clean Through" by Kao Chemical Company alternative of toluene or Freon, so that non exposed portion other than the light guides 3 was removed. After washing by water, the developed laminated product was dried.

After that, the transparent material "A" was spread on a side of the transparent layer of the laminated products to have a thickness of 50 μm, and the newly spread transparent material "A" was hardened by heating an hour in 100 degrees Celsius and further by heating an hour in 150 degrees Celsius, so that the light guide layer 1 was formed.

The transparent material "C" was further spread on a surface of the light guide layer 1 to have a thickness of 40 μm as the adhesive layer 15, and the transparent material "C" was dehydrated. Then, a printed circuit board 16 of an FR-5 type with electric circuits was disposed on the adhesive layer 15 and pressed by vacuum press in 170 degrees Celsius so as to adhere the printed circuit board 16 to the light guide layer 1 through the adhesive layer 15.

Subsequently, conformal mask holes having a diameter of 100 μm and reference guides were formed at portions on the metal thin film 101 at which via holes of metal layers are to be formed. After that, through holes having a diameter of 100 μm were formed on the metal thin film 101 by irradiating excimer laser beams on the above portions. In addition, surface treating such as desmear processing by permanganate and soft-etching process by hydrogen peroxide were performed to the lamination of the printed circuit board 16 and the light guide layer 1. After forming the through holes, a copper thin film was entirely coated on surfaces of the lamination of the printed circuit board 16 and the light guide layer 1, in which electric conductive layers were formed on surfaces of the through holes as via holes by copper plating processes.

Subsequently, the mounting lands 7 and the electric circuit 9a were formed on the surface of the light guide layer 1 by patterning the copper thin film by the following processes.

At first, a photo-sensitive resist was spread on the surface of the copper thin film, and the photo-mask 112 was aligned and disposed on the resist layer. Then, ultraviolet light was irradiated on the resist layer through the photo-mask 112 so that a part of the resist layer corresponding to the pattern of the photo-mask 112 was hardened. The resist layer other than the hardened portion was removes so that an etching resist pattern was formed on the surface of the copper thin film.

Subsequently, the lamination of the printed circuit board 16 and the light guide layer 1 was dipped into an etchant so as to solve unnecessary portion of the copper thin film. Finally, the etching resist pattern was removed from the surface of the copper thin film so that the mounting lands 7 and the electric circuit 9a were formed.

It is needless to say that the reference mark previously formed on the metal thin film 101 was used to align the photo-mask 112. The mounting lands 7 were formed only the side on which the photoelectric transducer (VCSEL) 5 is to be mounted. Since the diameters of the circular electrode pads 5b and 5c and the light emitting portion 5a of the VCSEL were respectively 50 μm and 10 μm and the distance between the center of them was 102.5 μm, a length of segments binding the outlines of the electrode pads 5b and 5c and the light emitting portion 5a were 72.5 μm. The mounting lands 7 were formed so as to overlap the outlines thereof on midlines of the segments. Each of the mounting lands 7 actually formed had a rectangular shape 122.5 μm (50 m+72.5 μm) on a side. At this time, a tolerance allowed to discrepancy to form the openings 22 were 36.25 μm.

Subsequently, the solder resist layers 8 were formed on the mounting lands 7 by the following processes. A quantity 800 g of a liquid resist material of DSR-2200KP 19 and a quantity of 200 g of a curing agent CA-2200KP 11 were mixed and agitated in 30 minutes, and the mixture of them (corresponding to the resin layer 21) was spread on the surface of the light guide layer 1 with the mounting lands 7 by screen printing. The lamination of the printed circuit board 16 and the light guide layer 1 with the resin layer 21 was previously baked 25 minutes in 75 degrees Celsius. Then, the photo-mask 113 which was designed to cover the mounting lands 7 was aligned and disposed on the resin layer 21, and ultraviolet light with an energy density of 400 mJ/cm$^2$ was irradiated on the resin layer 21 through the photo-mask 113. After that, the resin layer 21 other than the exposed portion was washed away by emitting a jet of solution of $Na_2CO_3$ of 1.0 mass % in water with a pressure of 0.2 MPa. After removing the unexposed portion of the resin layer 21, the exposed remainder of the resin layer 21 was hardened 30 minutes in 150 degrees Celsius. The thickness of the hardened resin layer 21, that is, the solder resist layers 8 was 20 μm.

Then, a KrF excimer laser by GSI Lumonics Inc. and a working sample stage specifically a biaxial table stage having a type number AX2020P4Y by THK CO., LTD. were connected to a programmable NC machine. Mechanical positioning accuracy of the machine was ±1 μm. In addition, a working point was visually confirmed with using an objective lens of five magnifications, a body tube TV-IE by CHUO PRECISION INDUSTRIAL CO., LTD. and ⅔ inch CCD camera.

The light deflectors 4 of the photoelectric composite board 10 which was obtained by the above mentioned processes were observed with the above mentioned CCD camera. A center of a virtual diagonal of the light deflector 4 was defined as the origin (0, 0), and a side of the light guide layer parallel to the anteroposterior direction of the light guide 3 was selected as the abscissa of the system of coordinates on the upper surface of the photoelectric composite board 10.

Subsequently, the coordinates (−72.5, −72.5) and (72.5, 72.5) of the centers of the circular electrode pads 62 and 63 of the VCSEL previously measured were inputted into a NC program. Then, patterning exposure was performed with using the KrF excimer laser and a stainless mask having a diameter of 1 mm at the center of each electrode pads 62 and 63, so that the opening 22 was formed on each the solder resist layer 8. Consequently, the electrode pads 11 to which the photoelectric transducer 5 is to be mounted were formed. It is needless to say that the above mentioned two systems of coordinates were coincided with each other by the NC program.

Energy density of the irradiation of the KrF excimer laser was 10 mJ per one pulse, frequency of the pulses of the excimer laser was 100 Hz, and a number of irradiation of the laser beams was 20 pulses. A diameter of the opening 22 on the surface of the solder resist layer 8 was 102 μm, and that on the surface of the mounting pads 7 (cupper thin film) was 98 μm.

Mounting of the VCSEL was tried on the photoelectric composite board 10 obtained as above. Solder bumps 6 were formed on the circular electrode pads 62 and 63 of the VCSEL, and the VCSEL was disposed on the electrode pads 11 of the photoelectric composite board 10. The photoelectric composite board 10 with the VCSEL was put in the reflow oven, so that the solder bumps 6 were reflowed. The reflow of solder bumps 6 was performed in a typical condition where the photoelectric composite board 10 with the VCSEL was heated more than 40 sec in 210 degrees Celsius, and the peak temperature was 230 degrees Celsius.

After mounting the VCSEL on the photoelectric composite board 10, a DC current of 3.2 mA was flown to the VCSEL so that the light was emitted to have an output of 1 mW. The light emitted from the light emitting portion 5a of the VCSEL enters into the light guide 3 through the light deflector 4 facing the light emitting portion 5a, passes through the light guide 3, and exit from the light deflector 4 disposed at the opposite end of the light guide 3. Thus, power of the light exited from the light deflector 4 on the opposite side of the light guide 3 was measured by a power meter through an optical fiber having a diameter of a core 100 μm and a numerical aperture (NA) 0.26.

As a measurement result, the power of the light emitted from the light deflector 4 on the opposite side of the light guide 3 was 0.34 mW, so that it is found that a loss of light through the light guide 3 was 4.5 dB. Since the loss of the light guide per 10 mm wag generally 0.15 dB, when the total loss 0, 9 dB of the light guide having a length 60 mm is subtracted from the measured loss 4.5 dB, the loss due to the light deflectors was calculated as 3.6 dB. Consequently, the power loss due to a single light deflector was estimated as 1.8 dB. In view of reflection loss on the boundary between the light guide 3 and the air, a favorable photoelectric connection was realized.

In addition, the photoelectric composite boards formed by the above mentioned method in accordance with the present invention and the photoelectric composite boards formed by the conventional processes of using only the photo-mask method were respectively prepared 10 sheets, and the VCSELs were mounted on the photoelectric composite boards. The power loss per one light deflector with respect to each photoelectric composite board was evaluated. Consequently, the power loss per a single light deflector in the photoelectric composite board formed by the conventional processes of using only the photo-mask method was in a range from 2.5 to 10.0 dB, and a mean value thereof was 6.3 dB. In contrast, the power loss per a single light deflector in the photoelectric composite board formed by the method in accordance with the present invention was in a range from 1.3 to 2.5 dB, and the mean value was 1.8 dB. Thus, when the photoelectric transducer was mounted on the photoelectric composite board formed by the method in accordance with the present invention, the mean value and the variation of the power loss was prominently improved.

SECOND SPECIFIC EXAMPLE

Subsequently, a second specific example of the method for forming the photoelectric composite board in accordance with the present invention is described.

The photoelectric composite boards 10 in the second specific example were formed to the process of forming the solder resist layers 8 by the same processes described in the first specific example. Then, the light deflector 4 was observed by the CCD camera from above, and a point which is shifted by 3.3 μm along the abscissa from the center of the coordinates on the photoelectric composite board was set as the reference point. The value 3.3 μm was calculated as the most suitable reference point with geometrical-optical calculation in view of the facts that the refraction index (n1) of the core of the light guide 3 was 1.53, the refraction index (n2) of the clad was 1.51, an emission angle of the VCSEL to the light deflector having a square 40 µm on a side when it is projected on the surface of the photoelectric composite board 10 was 18 degrees.

Similar to the above mentioned first specific example, the photoelectric composite boards formed by the above mentioned method in accordance with the present invention were prepared 10 sheets, and the VCSELs were mounted on the photoelectric composite boards. The power loss per one light deflector with respect to each photoelectric composite board was evaluated. Consequently, the power loss per a single light deflector in the photoelectric composite board formed by the method in accordance with the present invention was in a range from 1.1 to 2.5 dB, and the mean value was 1.6 dB.

THIRD SPECIFIC EXAMPLE

Subsequently, a third specific example of the method for forming the photoelectric composite board in accordance with the present invention is described.

The photoelectric composite boards 10 in the third specific example were formed to the process of forming the solder resist layers 8 by the same processes described in the first specific example. Then, while the VCSEL was driven to emit light having a power of 10 mw, the light was entered into the light deflector 4 from a level higher by 60 µm from the mounting lands 7 on the surface of the photoelectric composite boards 10. The light exited from the light deflector 4 on the opposite side of the light guide 3 passing through the light guide 3 was received through an optical fiber having a diameter of a core 100 µm and a numerical aperture (NA) 0.26, and the power of the light exited from the light deflector 4 on the opposite side of the light guide 3 was measured by a power meter. While the power of the light exited from the light deflector 4 was measured, the position of the VCSEL was varied with respect to the photoelectric composite board 10 so that the position where the power of the received light became the largest was confirmed.

Subsequently, the condition that the power of the light exited from the light deflector 4 became the largest was observed by the CCD camera from above, the position of the light deflector where the power of the received light became the largest was set as the reference point. In addition, the position corresponding to the center of the light emitting portion 5a of the VCSEL was defined from the upper surface side on the bases of the outline of the VCSEL by previously recording the layout on a bottom face of the VCSEL.

Subsequently, the VCSEL was removed from the photoelectric composite board 10, and the light deflector 4 was observed by the CCD camera so that the openings 22 were formed by the KrF excimer laser on the basis of the reference point, similar to the first specific example. Similar to the above mentioned first specific example, the photoelectric composite boards formed by the above mentioned method in accordance with the present invention were prepared 10 sheets, and the VCSELs were mounted on the photoelectric composite boards. The power loss per one light deflector with respect to each photoelectric composite board was evaluated. Consequently, the power loss per a single light deflector in the photoelectric composite board formed by the method in accordance with the present invention was in a range from 1.0 to 2.0 dB, and the mean value was 1.4 dB.

As mentioned above, when the photoelectric transducer is mounted on the photoelectric composite board formed by the method in accordance with the present invention, since the electrode pads 11 to which the photoelectric transducer is mounted is formed precisely with respect to the light deflector in comparison with that of the conventional photoelectric composite board formed by using only the photo-mask methods. Consequently, the optical axes of the light emitting portion or light receiving portion 5a of the photoelectric transducer 5 and the light deflector 4 can be aligned precisely, and thus, connection between the optical circuit and the electric circuit can be realized with a high efficiency.

This application is based on Japanese patent application 2005-272653 filed Sep. 20, 2006 in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A method for forming a photoelectric composite board comprising the steps of:
   forming a light guide layer having a light guide with a light deflector on a metal thin film;
   forming mounting lands on a surface of the light guide layer;
   forming solder resist layer on the surface of the light guide layer so as to cover the mounting lands;
   setting a reference point on the surface of the light guide layer just above the light deflector;
   defining coordinates of centers of electrode pads to which an photoelectric transducer is mounted with respect to the reference point on the solder resist layer so as to overlap a center of a light emitting portion or a light receiving portion of the photoelectric transducer on the light deflector when the photoelectric transducer is mounted on the photoelectric composite board; and
   forming openings on the solder resist layer on a basis of defined coordinates so that a part of each the mounting land is exposed, and thereby, the electrode pads to which the photoelectric transducer is mounted are formed.

2. The method in accordance with claim 1, wherein the step of defining the coordinates of the centers of the electrode pads is performed by using coordinates of centers of electrode pads of the photoelectric transducer to which solder bumps are formed with respect to the center of the light emitting portion or the light receiving portion of the photoelectric transducer, previously defined.

3. The method in accordance with claim 1, wherein the openings are formed by irradiating laser beams on the solder resist layer.

4. A method for forming a photoelectric composite board comprising the steps of:
   forming a reference mark on a metal thin film;
   forming a first transparent layer on a surface of the metal thin film;
   forming a second transparent layer having a refraction index different from that of the first transparent layer on a surface of the first transparent layer;
   disposing a first photo-mask to face a surface of the second transparent layer on a basis of the reference mark;
   irradiating light to the second transparent layer through the photo-mask so as to form a light guide by hardening exposed portion of the second transparent layer by the light;
   forming a light deflector on an end of the light guide;
   removing the second transparent layer other than the light guide;

spreading a transparent material which is same as a material of the first transparent layer on the first transparent layer so as to form a light guide layer including the light guide and the light deflector;

fixing a circuit board with at least an electric circuit on a surface of the light guide layer opposite to the metal thin film;

spreading a photoresist on a surface of the metal thin film opposite to the light guide layer;

disposing a second photo-mask to face the metal thin film via the photoresist on a basis of the reference mark;

irradiating a light to the photoresist through the second photo-mask to form a photoresist pattern on the surface of the metal thin film;

etching the metal thin film other than a portion covered by the photoresist pattern so as to form at least mounting lands and an electric circuit on a surface of the light guide layer opposite to the circuit board;

spreading a light hardening resin of the surface of the light guide layer with the mounting lands and the electric circuit;

disposing a third photo-mask to face the surface of the light guide layer via the light hardening resin on a basis of the reference mark;

irradiating a light to the light hardening resin through the third photo-mask to form solder resist layers that covers the mounting lands;

removing the light hardening resin other than the solder resist layers; and forming openings on the solder resist layers by irradiating laser beams at points corresponding to center of electrode pads of a photoelectric transducer which is to be mounted on the photoelectric composite board, so that electrode pads to which the photoelectric transducer is mounted are formed by exposing a part of each mounting lands through the openings, wherein coordinates of the points on the surface of the light guide layer is defined on a basis of a reference point defined above the light deflector.

5. The method in accordance with claim 4, wherein positional relations between a center of a projection of the light deflector and points corresponding to the centers of the electrode pads on the surface of the light guide layer further correspond to positional relations between a center of light emitting portion or a light receiving portion and centers of electrode pads of the photoelectric transducer.

6. The method in accordance with claim 4, wherein a system of coordinates on the surface of the light guide layer is defined so that a center of a projection of an outline of the light deflector is defined as an origin of the coordinates, and a direction parallel to a longitudinal direction of the light guide is defined as an abscissa.

7. The method in accordance with claim 6, wherein a center of a light emitting portion or a light receiving portion of the photoelectric transducer is defined as an origin of a system of coordinates on a surface of the photoelectric transducer;

the system of coordinates on the surface of the light guide layer corresponds to the system of coordinates on the surface of the photoelectric transducer; and coordinates of centers of electrode pads of the photoelectric transducer with respect to the center of the light emitting portion or the light receiving portion which are previously measured are used as the coordinates of the points on the surface of the light guide layer so as to irradiate the laser beams.

8. The method in accordance with claim 4, wherein the reference mark on the metal thin film is formed at a position other than a center of a projection of the light deflector.

* * * * *